(12) United States Patent
Jacob et al.

(10) Patent No.: US 7,002,168 B2
(45) Date of Patent: Feb. 21, 2006

(54) DENSE PLASMA FOCUS RADIATION SOURCE

(75) Inventors: Jonah Jacob, Brookline, MA (US);
Joseph A. Mangano, Arlington, VA (US); James Moran, Charlestown, MA (US); Alexander Bykanov, Belmont, MA (US); Rodney Petr, Acton, MA (US); Mordechai Rokni, Jerusalem (IL)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 10/442,544

(22) Filed: May 21, 2003

(65) Prior Publication Data

US 2004/0071267 A1 Apr. 15, 2004

Related U.S. Application Data

(60) Provisional application No. 60/419,941, filed on Oct. 21, 2002, provisional application No. 60/418,869, filed on Oct. 15, 2002.

(51) Int. Cl.
*H01J 35/00* (2006.01)

(52) U.S. Cl. .................................. 250/504 R
(58) Field of Classification Search ............ 250/504 R, 250/493.1, 492; 378/119
See application file for complete search history.

(56) References Cited

U.S. PATENT DOCUMENTS

| | | |
|---|---|---|
| RE34,806 E | 12/1994 | Cann |
| 5,763,930 A | 6/1998 | Partlo |
| 5,963,616 A | 10/1999 | Silfvast et al. |
| 6,031,598 A | 2/2000 | Tichenor et al. |
| 6,051,841 A | 4/2000 | Partlo |
| 6,064,072 A | 5/2000 | Partlo et al. |
| 6,307,913 B1 | 10/2001 | Foster et al. |
| 6,452,194 B1 | 9/2002 | Bijkerk et al. |
| 6,452,199 B1 | 9/2002 | Partlo et al. |
| 6,714,624 B1 * | 3/2004 | Fornaciari et al. .......... 378/119 |
| 6,815,700 B1 * | 11/2004 | Melnychuk et al. .... 250/504 R |
| 2002/0014598 A1 | 2/2002 | Melnychuk et al. |
| 2002/0014599 A1 | 2/2002 | Rauch et al. |
| 2003/0006383 A1 | 1/2003 | Melnychuk et al. |

* cited by examiner

*Primary Examiner*—John R. Lee
*Assistant Examiner*—Anthony Quash
(74) *Attorney, Agent, or Firm*—William Cray

(57) ABSTRACT

A dense plasma focus radiation source for generating EUV radiation using Lithium vapor and including a coaxially disposed anode and cathode. The invention includes methods and apparatuses for enhancing the efficiency of EUV radiation production, for protecting, cooling and extending the life of the anode and cathode, for protecting and shielding collecting optics from debris and pressure disturbances in the discharge chamber, and for feeding Lithium into the discharge chamber.

72 Claims, 8 Drawing Sheets

DENSE PLASMA FOCUS RADIATION SOURCE

CROSS-REFERENCE TO RELATED APPLICATIONS

This application claims priority under 35 U.S.C. § 119(e) to U.S. Provisional Applications Ser. No. 60/418,869 entitled "INTELLECTUAL PROPERTY DESCRIPTION", filed Oct. 15, 2002 and Ser. No. 60/419,941 entitled "MEASUREMENTS OF SHOCK WAVE PARAMETERS FROM THE DPF X-RAY POINT SOURCE," filed Oct. 21, 2002, both of which are herein incorporated by reference in their entirety.

BACKGROUND

1. Field of the Invention

The present invention relates to dense plasma focus radiation sources for the production of extreme ultraviolet radiation, useful for lithography, and more particularly, to methods of Lithium delivery into the plasma, to methods of heat removal from the electrodes, to methods of improvement of lifetime of electrodes, to methods of improvement uniformity of the discharge and to methods and apparatuses for protecting the optics within the plasma radiation source, from the plasma.

2. Discussion of Related Art

Features on semiconductor wafers may be produced using lithography techniques. At present deep ultraviolet (DUV) lithography techniques use DUV lasers having a wavelength of the order of 200 nanometers (nm) which can be used to print sizes of about 100 nm. However, as semiconductor technology improves and the size of semiconductor devices decreases, it may be desirable to be able to print features with a size of the order of 70 nm and smaller. In order to print features of this size, a lithography light source with a smaller wavelength than DUV is needed. Presently, a light source of choice is in the extreme ultraviolet (EUV) having a wavelength of about 13.5 nm.

Plasma devices that may be used as radiation generators comprise of a center electrode and an outer electrode substantially coaxial with the center electrode, with a coaxial column being formed between the electrodes. FIG. 1 illustrates an example of a discharge chamber portion of a high repetition rate dense plasma focus (DPF) radiation source with a coaxial electrode geometry. A selected gas, for example, a mixture of noble gases or mixture of noble gas with Lithium or Tin vapor, may be introduced into a column 26 through an inlet mechanism (not illustrated) to provide the plasma medium. The plasma is initially ignited over the surface of the insulator 42 that electrically isolates the anode 46 and the cathode 44 and is subsequently driven as a plasma sheath off the insulator. The outer electrode 44 (the cathode) may be solid (as illustrated) or may be a plurality of substantially evenly spaced rods arranged in a circle (not illustrated). A high repetition rate pulse driver 28 is provided at a base of column 26. The driver 28 is adapted to deliver a high voltage pulse across the electrodes. The plasma sheath is driven by magnetic forces from the base end of the column to the end of the column where the plasma sheath pinches near the top of the center electrode. The magnetic forces resulting from the current flowing between the electrodes drive the plasma sheath up the coaxial column 26. Once the plasma sheath has reached the tip of the anode 46, magnetic forces drive the plasma radially inward, causing a pinch 30 with a radially trapped slug of ionized gas that reaches a high temperature. The amplitude of the pulse voltage, the current rise time of the pulse, the gas pressure and the electrode lengths may be selected so that the current for each discharge pulse is substantially at its maximum as the plasma pinches. The high temperature plasma in the pinch produces radiation 32 in the desired EUV band centered around 13.5 nm. The amplitude of the EUV radiation and it's wavelength are controlled through careful selection of various device and plasma parameters including the selected gas fed to the pinch, the amplitude and pulse length of the current produced from the driver 28, the plasma temperature in the area of the pinch, and the gas pressure in the column. This type of DPF device can also be designed to radiate at shorter wavelengths. However for shorter wavelength radiation, a higher plasma temperature is desired. Some examples of plasma guns are described in U.S. Pat. No. 6,300,720 to Birx, issued Oct. 9, 2001, which is herein incorporated by reference in its entirety.

SUMMARY OF THE INVENTION

According to one embodiment, a dense plasma focus radiation source comprises an anode, a cathode and a heat pipe constructed to bring a liquid element in close proximity to the anode, so as to cool the anode, wherein the dense plasma focus radiation source is adapted to generate extreme ultraviolet (EUV) radiation at electromagnetic wavelengths near 13.5 nm using Lithium vapor in a discharge chamber.

According to another embodiment, a dense plasma focus radiation source comprises a plasma radiation source adapted to produce radiation and comprising a plasma pinch focus region, optical elements positioned near the plasma radiation source and adapted to receive at least some of the radiation produced by the plasma radiation source, and an optically transmissive barrier disposed between the plasma radiation source and the optical elements.

In another embodiment, a dense plasma radiation source comprises a plasma radiation source adapted to produce radiation, a first gas jet providing a first gas stream at a first exit speed and having a first temperature, a second gas jet providing a second gas stream at a second exit speed substantially equal to the first exit speed and having a second temperature substantially equal to the first temperature, the first and second gas streams together comprising a gas curtain comprising a diffusion layer disposed between the first and second gas streams, and a first recovery duct positioned and sized so as to capture a substantial portion of the diffusion layer.

According to a further embodiment, a dense plasma radiation source comprises an anode and a cathode disposed in a coaxial arrangement about a longitudinal axis along a center of the anode, and a gas curtain comprising an axisymmetric flow pattern disposed above the anode, wherein the gas curtain comprises Lithium vapor.

In yet another embodiment, a dense plasma radiation source comprises a plasma radiation source adapted to produce radiation and comprising a plasma pinch focus point, optical elements positioned above the plasma radiation source and adapted to receive at least some of the radiation produced by the plasma radiation source, and a first web of refractory metal elements defining a series of open channels substantially aligned with the plasma pinch focus point disposed between the plasma radiation source and the optics.

According to one embodiment, a method for cooling an anode of a plasma radiation source comprises bringing Lithium into close proximity with the anode using a heat pipe such that heat from the anode causes evaporation of the Lithium to a Lithium vapor in an evaporation region of the heat pipe, thereby cooling the anode, condensing the Lithium vapor to provide liquid Lithium, and returning the liquid Lithium to the evaporation region of the heat pipe using a wick.

According to another embodiment, a method for protecting optical circuitry in the vicinity of a plasma radiation source comprises providing a first vapor stream having a first temperature and a first exit speed, providing a second vapor stream in a same direction as the first vapor stream and having a substantially matching temperature and exit speed as the first vapor stream, such that a diffusion layer is formed between the first and second vapor streams, and recapturing at least a portion of the diffusion layer to recycle at least some of vapor forming the diffusion layer.

In another embodiment, a method for protecting optical elements in the vicinity of a plasma radiation source comprises producing Lithium vapor in a discharge chamber of the plasma radiation source, providing for the Lithium vapor to flow upward in the discharge chamber, providing a downwardly-directed noble gas buffer flow in the discharge chamber, thereby creating a gas curtain comprised of the Lithium vapor and noble gas that shield the optical elements from the plasma radiation source.

According to yet another embodiment, in a radiation generating environment comprising a plasma radiation source and optical elements located above the plasma radiation source adapted to focus or direct the radiation, a method of protecting the optics comprises providing an optically transmissive barrier between the plasma radiation source and the optical elements.

In a further embodiment, a dense plasma focus radiation source comprises a radiation source including an anode and a cathode disposed coaxial with the anode, the radiation source adapted to generate EUV radiation using Lithium vapor extracted from the anode, a pulsed discharge circuit adapted to generate an electromagnetic (EM) field so as to cause a plasma pinch at a tip of the anode, the plasma pinch generating the EUV radiation, and a radio frequency (RF) discharge circuit adapted to effect extraction of the Lithium vapor from the anode.

BRIEF DESCRIPTION OF THE DRAWINGS

The foregoing and other features and advantages of the present invention will be apparent from the following non-limiting discussion of various illustrative embodiments and aspects thereof with reference to the accompanying figures. It is to be appreciated that the figures are provided as examples for the purposes of illustration and explanation and are not intended as a definition of the limits of the invention. In the figures, in which like elements are represented by like reference numerals.

DETAILED DESCRIPTION

Figure 1:
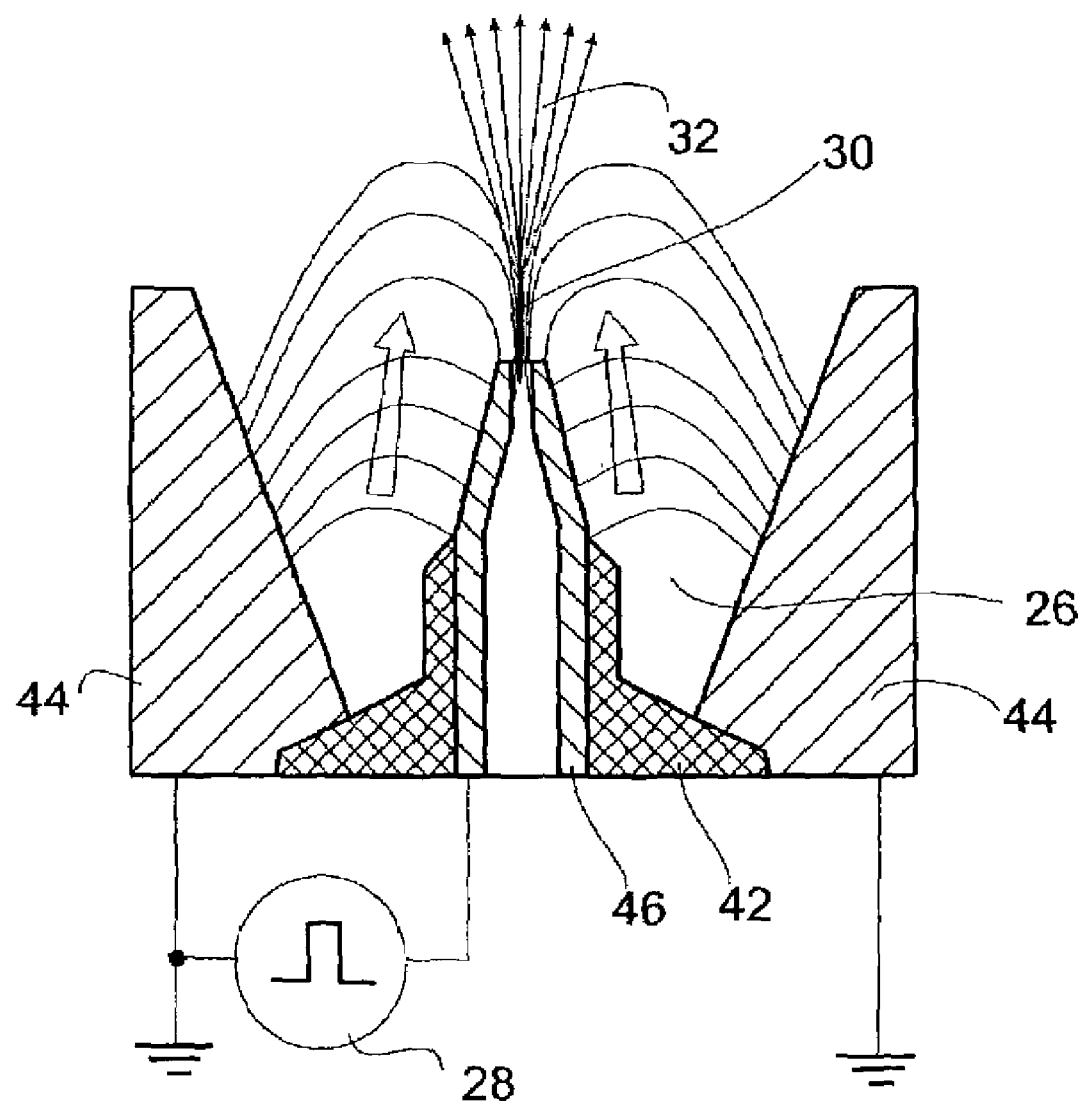
FIG. 1 is a cross-sectional schematic diagram of a discharge chamber portion of a related art high repetition rate dense plasma focus (DPF) radiation source.

Various illustrative embodiments and examples of the present invention and aspects thereof will now be described in more detail with reference to the accompanying figures. It is to be understood that the invention is not limited in its application to the details of the construction and arrangement of the components set forth in the following description or illustrated in the drawings. Other applications, details of construction, arrangement of components, embodiments and aspects of the invention are possible. Also, it is further to be understood that the phraseology and terminology used herein is for the purpose of description and should not be regarded as limiting. The use of "including," "comprising," or "having" and variations thereof is meant to encompass the items listed thereafter and equivalents thereof as well as additional items.

Figure 2:
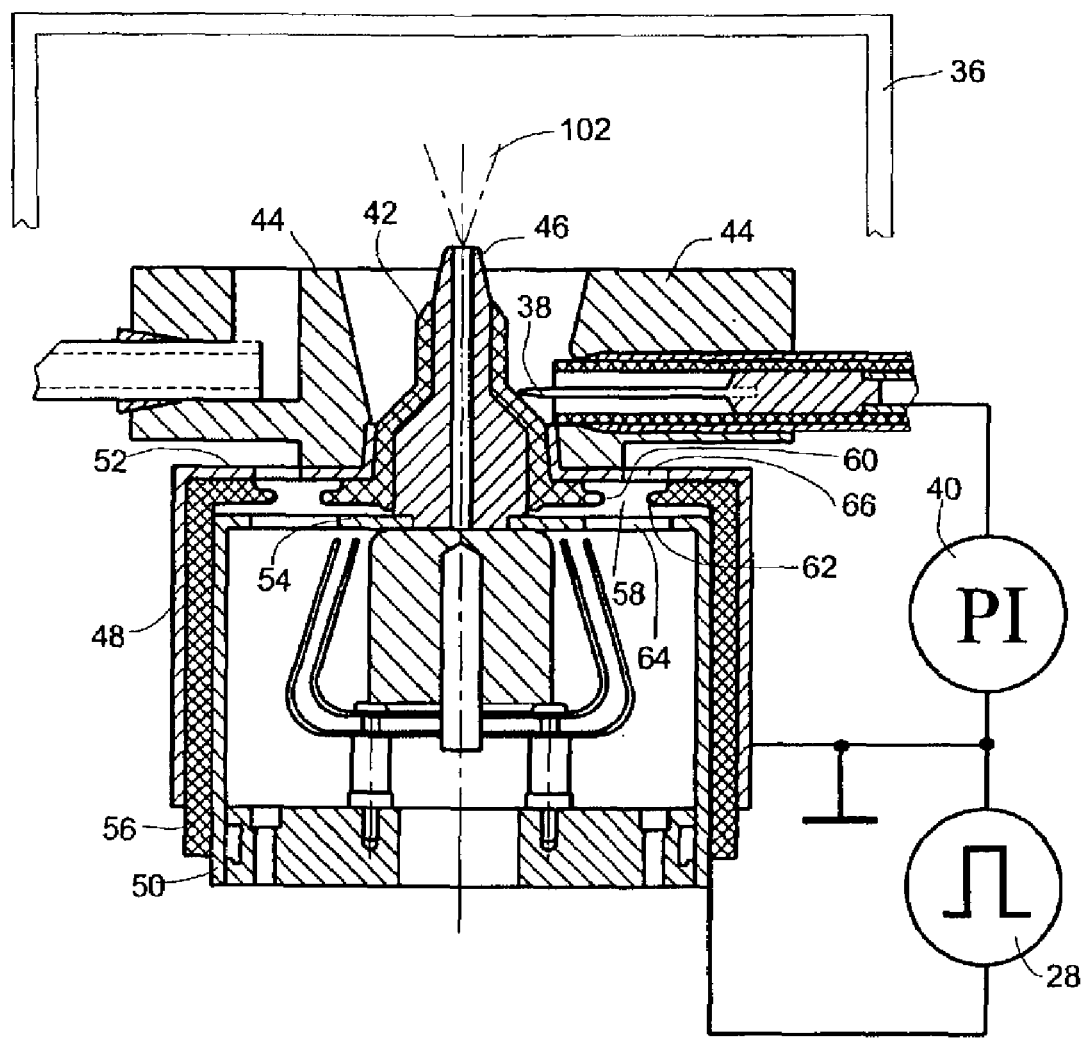
FIG. 2 is a cross-sectional schematic diagram of an example of a portion of a dense plasma focus radiation source according to aspects of the invention.

Referring to FIG. 2 illustrated a schematic cross-sectional diagram of a portion of a dense plasma focus (DPF) radiation source 34 according to one embodiment of the invention. According to an aspect of this embodiment, the DPF source 34 includes a discharge chamber 36 where the plasma discharge may occur in an axisymmetric configuration as illustrated in FIG. 2. The gas is preionized near and around preionization electrodes 38 from energy delivered by a preionizing generator 40. This may initiate the plasma discharge in a sheet over a surface of an insulator 42 between the cathode 44 and the base of the anode 46. Methods and apparatuses for preionization that may be used with the invention are discussed in detail in U.S. Pat. No. 6,300,720 to Birx, issued Oct. 9, 2001, which is herein incorporated by reference in its entirety. As discussed in reference to FIG. 1, a pulse driver 28 delivers a high voltage pulse across the electrodes, causing current to flow between the electrodes and the plasma to propagate from the base end of column (formed by the coaxial anode and cathode electrodes). The plasma is driven up the anode by magnetic forces resulting from the current flow. A plasma pinch is generated at the tip of the anode 46 by the magnetic field resulting from the current flowing through the plasma sheath. The paths for current delivery and current return be properly insulated from one another, especially where the paths are close to the symmetry axis of the electrodes or in close proximity to one another (which may be desirable in view of space and/or size constraints). It should be appreciated the current should be rapidly pulsed in order to generate a magnetic field of sufficient strength to cause the plasma to pinch. To achieve that goal, the electrical circuitry, the current path geometry and the discharge parameters should be designed so as to minimize the inductance along the current path. According to one example, the DPF source may be configured so that current paths exist along coaxial cylinders 48, 50, as shown in FIG. 2. The coaxial cylinders 48, 50 may be joined electrically to parallel discs 52, 54, respectively, which in turn are joined to the anode 46 and cathode 44. The coaxial cylinders are insulated from one another by insulator 56. This geometry may serve the added function of thermal isolation of the anode/cathode structure from the room environment, as discussed further below.

According to one embodiment, the discharge gaseous medium provided in the discharge chamber and used to generate EUV radiation may be Lithium vapor at a pressure of the order of approximately 0.5 torr. A relatively high temperature, approximately 700° C., is used to maintain the Lithium vapor at this pressure. Consequently, it may be desirable to achieve at least partial thermal isolation between the hot discharge chamber and circuit elements that are at, for example, ambient temperature or are unable to operate at such high temperatures. Furthermore, thermal isolation may be desirable to reduce the heat leakage from the discharge chamber and thereby reduce the energy used to maintain the discharge chamber at approximately 700° C. Heat losses may be minimized by, for example, using relatively thin electrical conductors, such as the coaxial cylinders 48, 50 and the parallel discs 52, 54 (as discussed above), and/or by using insulators with low thermal conductivity. However, it is to be appreciated that alternate methods and structures may be used to achieve thermal isolation.

According to one example, to minimize the thermal conductivity and the heat losses, thin-walled coaxial cylinders 48, 50 may be used to deliver the current to the plasma. In the DPF system, the current is supplied in short pulses, and thus flows predominantly in the surface layer of the conductor carrying the current. Therefore, the thin-walled coaxial cylinders 48, 50 are suitable conductors for this application since there is no need for a large conductive area to provide a low resistance as the current pulses flow mainly through the surface layer. An advantage of using thin-walled coaxial cylinders is that the heat losses can be minimized, since they are poor thermal conductors (the space between the cylindrical conductors may be under vacuum or it may be filled with, for example, air or other appropriate heat and electrical insulating material). The thin walled coaxial conductors may be designed (in compliance with constraints dictated by the necessity to minimize heat conduction and by other considerations) to have a length as short as possible, a diameter as large as possible and an inter-cylinder spacing as small as possible, to obtain a relatively low inductance, which is desirable since the current is supplied in short pulses.

Referring to FIG. 2, an anode insulator 42 is provided on the anode electrode 46 to electrically isolate the anode and the cathode. A second insulator 56 is also provided between the coaxial current path cylinders 48, 50. Two criteria may be important to consider when selecting an insulator material for the anode insulator 42 and/or the second insulator 56. First, the insulator material should be able to withstand a peak driving voltage of 5 to 15 kilovolts (kV) in a Lithium environment at temperatures of up to approximately 700° C. Second, the insulator material should have low thermal conductivity to provide the necessary thermal isolation, and should also have high strength, low Young's modulus and a low thermal expansion coefficient to withstand thermal stresses.

It may be difficult to identify a single material that satisfies all the above-mentioned criteria. Therefore, according to one embodiment, as illustrated in FIG. 2, different insulators may be selected for different regions and requirements of the DPF radiation source. For example, the anode insulator 42 may be made of Aluminum Nitride (AlN) which has high dielectric strength at 700° C. and is compatible with Lithium at this temperature. However, AlN has high thermal conductivity and it may be difficult to fabricate. Thus, the second coaxial insulator 56 may comprise, for example, quartz which has high strength at small thickness and has low thermal conductivity and good thermal stress properties. Quartz is also available in many sizes at moderate cost. However the dielectric strength of quartz drops dramatically with increasing temperature, so it is likely that it may not be a suitable insulator above 400° C. This limitation of quartz may prevent a direct linkage from the anode insulator 42 made of AlN to the second insulator 56 made of quartz. Consequently, an intermediate region of vacuum or of another insulating material, such as, for example, certain types of Boron Nitride (BN), may be provided to make the transition from the anode insulator 42 to the second insulator 56.

In the embodiment illustrated in FIG. 2, a vacuum gap 58 is provided between the anode insulator 42 and the second coaxial insulator 56. The use of a vacuum gap as the transition insulator is viable provided the size of the gap 58 is selected judiciously to prevent breakdown. Breakdown voltage is described by the Paschen curve for the given gas, as is known by those of skill in the art. For the particular gap length d (on the order of a few millimeters) and pressure range p (below a torr), the pd product corresponds to the left-hand side of Paschen curve, when breakdown voltage increases with decrease of pd product. For example, for Helium, the so called "pd minimum" (pd product corresponding to the minimum breakdown voltage) is reached at about 4 torr cm. Estimates show that at pressure of $10^{-4}$ torr a gap of approximately 5 mm is sufficient to hold the voltage of 5 kV across the gap filled with Helium. The vacuum in gap 58 may be easily implemented since in normal operation of the plasma source, a vacuum is maintained above and below the discs 52 and 54. Communication between the vacuum regions above the upper disc 52, and the lower disc 54 can be established through small openings 64, 66 in the conducting discs 52, 54, respectively. Lithium leakage from the discharge region into the vacuum insulator may be minimized by close fitting interfaces between the anode insulator 42 and the anode 46 and the cathode 44. For example, in the illustrated example, the Lithium vapor pressure in the vacuum insulator region is estimated to be of order $10^{-5}$ torr. A good vacuum, and thus a good insulator, may be ensured by providing adequate open areas in the conducting discs 52, 54 to allow free communication between the upper and lower vacuum regions. The free communication is desirable to allow continual pumping of those regions to withdraw gases and particles that enter the vacuum region from the surrounding materials and thereby maintain the vacuum that would otherwise degrade due to the presence of these gases and particles.

In an alternate embodiment, an insulator such as, for example, Boron Nitride (BN), may be provided in the gap 58 instead of a vacuum. It is to be appreciated that many different materials may be used as the intermediate insulator in gap 58 and may be selected according to the many factors, such as different properties of the insulators 42, 56, and other criteria and specifications.

According to another aspect, also depicted in FIG. 2, terminating surfaces 60, 62 of the anode insulator 42 and second insulator 56, respectively, may be shaped, as illustrated, so as to prevent breakdown by surface tracking, which might occur as an electric arc over the surface of the material present on either side of a gap. Arcing by surface tracking can be eliminated by making the path along the insulator surface long enough, for example, by providing protrusions on the insulator surface, as illustrated in FIG. 2.

According to yet another aspect, the openings 64, 66 in the conducting discs 52, 54 may also serve additional purposes of relieving thermal stresses and preventing mechanical failure (buckling) under thermal stresses caused by the temperature drop of the order of 400° C. from the inner to the outer edges of the discs. It is to be appreciated that proper shaping of these openings may help to relieve thermal stresses, thus preventing yield of the discs 52, 54 to buckling. It should be appreciated that in the alternative configuration discussed above where BN or other insulating material replaces the vacuum insulator, the disc openings 64, 66 may also be included for the purpose of stress relief on the junctions between the different insulator materials.

Accordingly it is to be appreciated that the segments of the discharge circuit, such as the anode insulator 42, the second insulator 56 and the conducting discs 52, 54, which are depicted in FIG. 2 should have any or all of the properties of, high voltage standoff, low thermal conductivity, and structural rigidity.

During pulsed operation, the discharge anode 46 may be subjected to severe heat loads emanating from the plasma. For example, a representative anode 46 illustrated in FIG. 2 may, in some applications, be subject to a heat rejection on the order of approximately 5,000 Watts. This heat may arise from thermal energy delivered by energetic charged particles colliding with the anode and from the produced radiation. Combined radiative cooling and conduction cooling to the anode base, which may comprise, for example, Tungsten, may not maintain the anode tip at temperatures below melting. Therefore, additional cooling may be needed. Anode cooling could impose a limit on the discharge energy and the pulse rate and, consequently, on the practical use of this technique for EUV lithography. Therefore, it may be desirable to employ effective techniques for cooling the anode 46 that do not affect the discharge energy or pulse rate.

Figure 3:
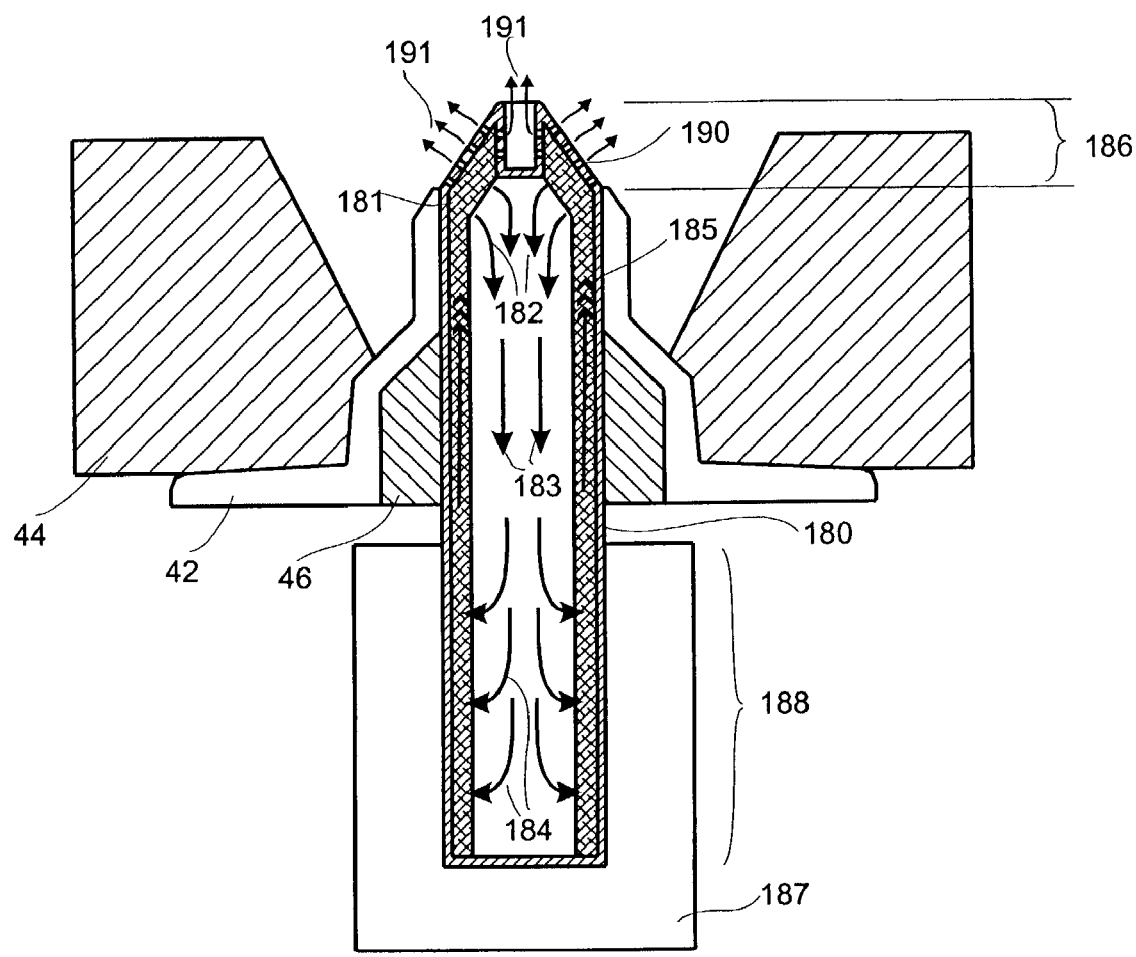
FIG. 3 is a cross-sectional diagram of a portion of a DPF radiation source including a heat pipe installed within the anode according to aspects of the invention.

According to one embodiment, a cooling method and apparatus includes applying a Lithium or other metal vapor to the anode by means of a heat pipe. Lithium or other alkali metals provide a most efficient vapor media for such heat pipes. Heat conduction of the order of 5,000 Watts within a heat pipe with a cross-section of about 0.5 cm$^2$ over a length of several centimeters is within current heat pipe capability. Referring to FIG. 3, there is illustrated one embodiment of an anode 46 with a heat pipe 180 installed for cooling the anode, and for Lithium feeding which is discussed in more detail below. Cooling of the anode 46 by means of heat pipe 180 works on the principle of liquid evaporation (shown by arrows 182) in the heated region 186 and condensation (shown by arrows 184) in the "cold" region 188 of heat pipe, and a return liquid path by means of a wick 181. The cold region 188 may be maintained at a desired temperature by using a chiller 187. The condensed liquid is returned from the cold region 188 to the "hot" evaporation region 186 by capillary action up the wick 181. The cooling process utilizes the large heat exchange of vaporization/condensation so that moderate vapor flow rates may be required, e.g. a heat load of 5 kW using Lithium with a heat of vaporization of 21 kJ/g, requires a vapor mass flow rate of only 0.24 g/sec. Although heat pipe technology has been used in other applications, for example, valve cooling through valve stems in automobiles and heat transfer from sunlit to shaded sides of satellites, it has not been applied for cooling in a DPF radiation source. Effective cooling of the anode 46 using heat pipe technique may be needed for power scalability of this lithography technology, because otherwise heat tolerance limits of the anode may limit the usable power of the DPF source. It is to be appreciated that the heat pipe cooling apparatus and method described herein using Lithium vapor is also complimentary to the EUV radiation producing process, because Lithium may be used as the plasma medium that generates the EUV radiation. Thus, an apparatus for handling Lithium may be already a part of the DPF source, such that minimal additional structure may be needed to implement the cooling. In addition, the walls of the heat pipe 180 may be provided with capillary holes 190 in the "hot" region 186 so that Lithium may evaporate, not only within the anode, as shown by arrows 182, but also into the DPF chamber through the capillary holes 190, as shown by arrows 191. Thus, the heat pipe may be used both for cooling the anode, as discussed above, and for feeding Lithium into the DPF discharge chamber.

Figure 4:
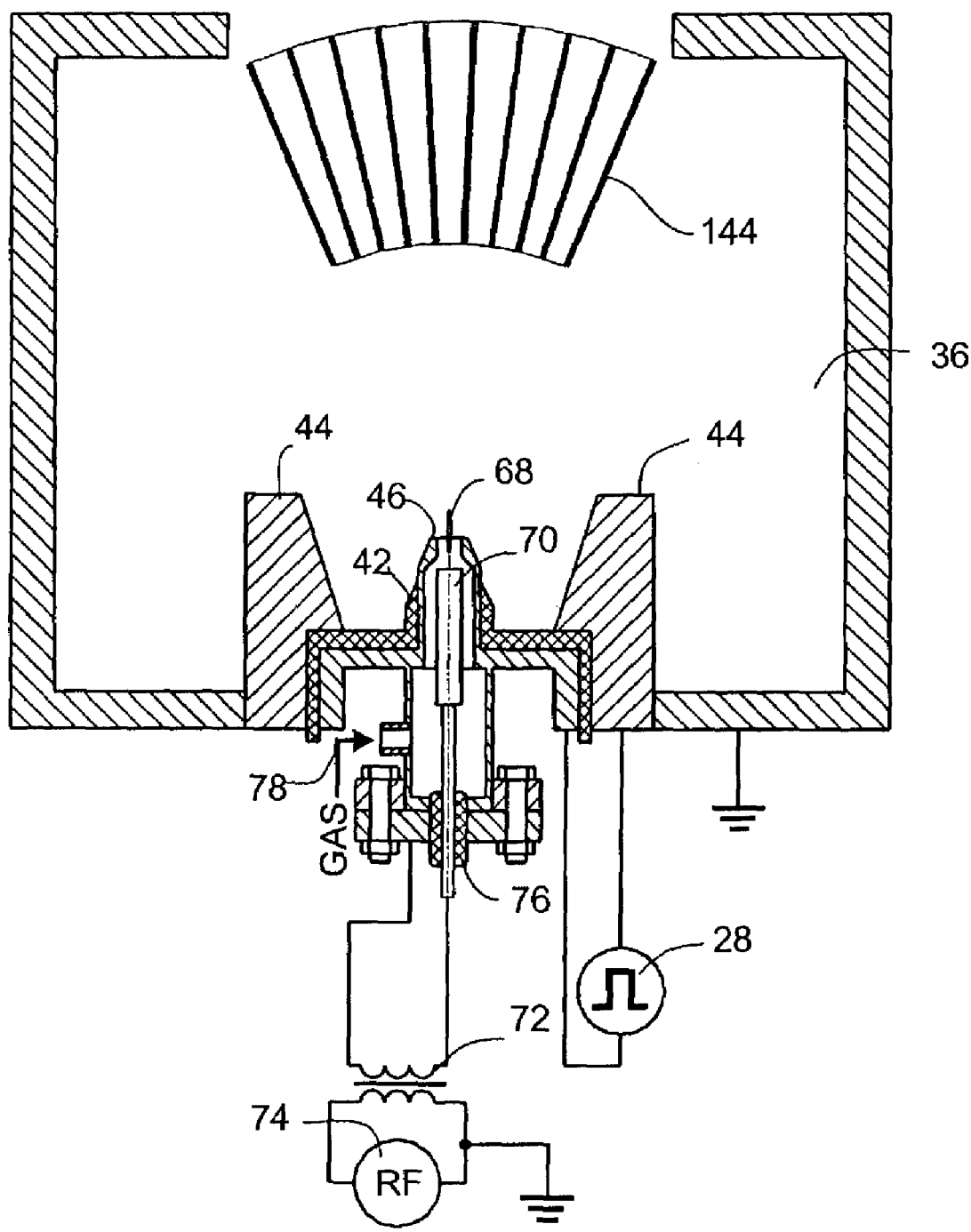
FIG. 4 is a cross-sectional schematic diagram of an example of a discharge chamber and circuitry of a plasma radiation source including an RF Lithium feeding system according to aspects of the invention.
Figure 8:
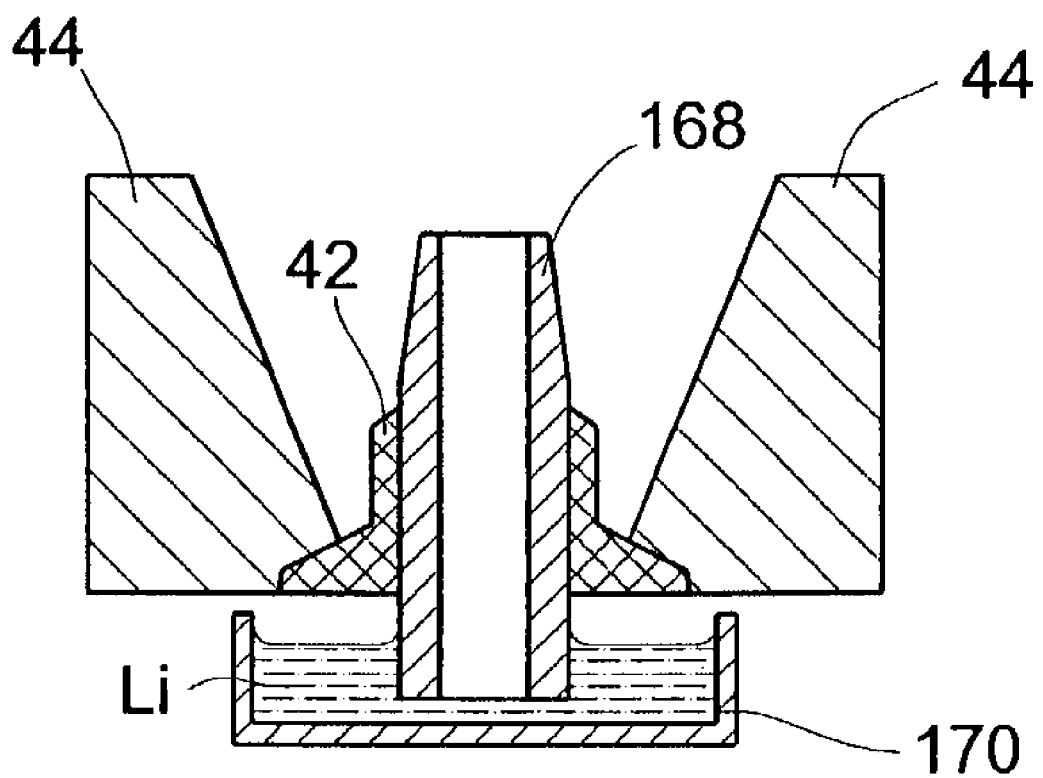
FIG. 8 is a schematic diagram of a portion of a porous anode fed from a tank containing liquid Lithium.

For the introduction of Lithium vapor into the column 26 (shown in FIG. 1), a discharge may be initiated in a coaxial geometry between a Lithium containing electrode and another electrode. Radio frequency (RF) or direct current (DC) voltages may be used to generate the discharge, either in a pulsed or a continuous wave (CW) mode of operation. Referring to FIG. 4, in one example, the Lithium containing electrode 70 may be a porous or a hollow cylinder impregnated with Lithium. In another example, the Lithium containing anode may be an anode fed with liquid Lithium from a reservoir by some other device, such as, for example, by a wick (see FIG. 8). In another example, referring to FIG. 8, there is illustrated a porous anode 168 that may be fed by a wick with Lithium from a reservoir 170 containing liquid Lithium. Of course, it is to be appreciated that Lithium may be applied to the anode in a different manner as may be known to those of skill in the art. In particular, referring again to FIG. 4, a Lithium impregnated electrode 70 may be installed inside a hollow anode 46 of the dense plasma focus system. In this case, an RF voltage may be applied between the central Lithium impregnated electrode 70 and the anode 46 of the plasma focus device, as shown schematically in FIG. 4, which also depicts the circuit elements (72, 74) for an RF discharge. Using an RF discharge, the two electrodes 46, 70 may be electrically isolated from ground by an RF transformer 72, as shown in FIG. 4, so that the discharge circuit for the Lithium feeding may be an independent unit, completely separated from the main DPF circuit.

According to one embodiment, Lithium may be extracted from the Lithium impregnated electrode 70 using thermal extraction when the porous element is heated up by the RF discharge to high temperatures (of the order of 400–800° C.). In this example, the Lithium concentration may be determined by the vapor pressure of Lithium at that particular temperature.

According to another embodiment, Lithium may be extracted from the Lithium impregnated electrode 70 using ion extraction. In this example, Lithium atoms may be extracted from the surface of the Lithium impregnated electrode 70 by bombardment of the electrode by noble gas and/or Lithium ions. With an RF discharge, positively charged sheath may be formed near the electrode 70. This sheath may be characterized by a fairly high electric field across the sheath which will accelerate Lithium or noble gas ions toward the surface of electrode 70. The ions bombarding the surface of the electrode 70 may have energies of tens to hundreds of electron-volts, depending on the nature of the gaseous medium, on its pressure, and on the RF voltage applied to the electrodes. The energetic ions may be capable of extracting Lithium from the surface of electrode 70, resulting in a Lithium concentration near the surface that exceeds the equilibrium concentration at the surface temperature.

According to one aspect, when the RF discharge is operated in a pulsed mode, it can be synchronized with the main DPF discharge from driver circuit 28, including an appropriate delay, so as to maximize the Lithium concentration during the main DPF discharge, thus achieving a reduction in the total Lithium consumption. A noble gas (Helium, Argon, Neon etc.) flow 78 may serve as a buffer medium for the Lithium feeding RF discharge. The noble gas flow 78 may also serve for transporting Lithium atoms through the DPF anode 46, to the anode tip region where the pinch 68 is formed during the DPF operation. Thus Lithium may be delivered precisely into the pinch region, resulting in a significant reduction in Lithium consumption. This may be desirable as it allows one load of solid Lithium to serve in the EUV device for a long time of operation. The decreased Lithium consumption may also simplify problems related to the discharge chamber 36 (which are discussed below) and Lithium contamination of the insulators and optical elements that are used to focus and direct EUV radiation produced by the DPF radiation source.

In one example of an RF coaxial discharge geometry suitable for use in the Lithium feeding system, the distance between electrodes may be of the order of approximately 0.1–0.2 inches and the operating vapor pressure may be between 0.1 and a few torrs. The RF voltage used for initiating the discharge under these conditions may be higher than 1 kV, whereas after the discharge ignition the RF voltages used for the optimal operation of the discharge may be of the order of 100–300 V. This difference between the igniting and the operating voltages of the discharge may put a severe limitation on the RF power supply requirements for the DPF apparatus. According to one embodiment, this problem may be alleviated by initiating the discharge at an elevated pressure (up to several torrs), which may need an RF voltage of only a few hundred volts, followed by a fast reduction of the pressure to the proper operational pressure immediately after the ignition.

According to another embodiment, the above-described problem may be avoided by initiating the Lithium feeding discharge using the main DPF discharge (pinch) as an igniter. In this case, electrons, ions and intense UV radiation generated by the pinch may be used to initiate the Lithium feeding discharge at the optimal operating pressure and voltage. Initially no Lithium will be present in the gaseous medium and the discharge may be initiated by the pinch in the noble gas buffer. But once ignited, the discharge may extract Lithium from the Lithium-impregnated electrode (by either methods described above) and within a few pulses the variation of the-Lithium concentration as a function of time will reach a steady state pattern. Lithium has a low ionization energy of 5.4 eV. As a result, the presence of Lithium in the discharge may reduce the threshold for the discharge ignition, making it possible to operate the discharge at voltages of 100–300 V and pressures of 0.1 to a few torrs. Thus, after the first initiation of the Lithium feeding discharge in the pulsed mode, subsequent ignitions may occur without a need for an external initiator because of the presence of Lithium vapor between the electrodes.

As discussed above, lack of efficient cooling of the anode 46 may shorten the life of the anode and place limits on the operating power of the DPF radiation source. In addition, the life of the cathode 44 may be limited by sputtering of cathode material caused by bombardment of the cathode by ions accelerated through the cathode fall region. The cathode fall is a region of high electrical field, usually confined to a thin layer of the discharge at the vicinity of the cathode. It is formed by the discharge dynamics, and it provides the necessary energy for extracting electrons from the cathode, by ionizing the gaseous medium in the layer and accelerating the charge carriers (ions and electrons), to reach the current level necessary to sustain the discharge. Positive ions in the cathode fall region are accelerated toward the cathode and impinge on it with high velocities, thus causing the cathode to sputter and damaging the its surface. Sputtering of anode material may also damage the anode and decrease its usable lifespan. According to one embodiment of the invention, Lithium may be used to extend the lifetime of both the cathode and the anode in the DPF apparatus. Using Lithium to achieve extended anode and cathode lifetimes may be particularly advantageous in the DPF apparatus of the invention because Lithium may already be used to cool the anode 46 and to generate the EUV radiation, as discussed above.

According to one aspect of the invention, covering the surface of the cathode, which may comprise, for example, Tungsten, with a thin layer of Lithium lowers the work function of the cathode (i.e. the amount of energy required to extract electrons from the cathode) from 4.5 eV to 2.4 eV. This may result in a dramatic reduction of the cathode fall. Further reduction of the cathode fall may be achieved by keeping the cathode at an appropriate elevated temperature for which all the electrons used for sustaining the discharge are supplied by thermionic emission from the Lithium coated cathode surface. Surface temperatures above 2,500° C. may achieve enough thermionic electron emission to sustain the discharge, however it may not be desirable to maintain the surface at such a high temperature. Therefore coating the anode with liquid Lithium may achieve the advantages discussed above and be a preferable solution. Another advantage of providing a thin coating of liquid Lithium over the cathode is that it will be self healing, in contrast to a solid electrode that sputters, resulting in an irreversible damage to the electrode surface. According to one embodiment, this may be achieved by using a porous cathode which may be constantly impregnated with liquid Lithium, supplied by a wick (not illustrated) from a reservoir. Under these conditions, the lifetime of the cathode may be limited only by the consumption of the liquid Lithium in the reservoir.

Similarly, the anode lifetime may also be extended by coating the anode with a thin layer of liquid Lithium. Again this can be achieved by using a combination of a Lithium impregnated porous electrode with a wick to supply the Lithium from a reservoir. The thin layer of liquid Lithium coating may extend the lifetime of the anode for at least two reasons. First, Lithium, which will be in the liquid phase as it emanates from the electrode pores, is self healing as described above and thus is resistant to permanent damage caused by debris or sputtering. Second, the presence of atomic Lithium in the discharge medium may cause a considerable reduction in the anode potential fall, as explained below, and that may result in reduced sputtering and damage to the anode and in a corresponding increase in the anode lifetime. Atomic Lithium at the ground state has a strong resonance transition to its first excited state of approximately 2 eV with a large cross-section for electron impact (about 70 square Angstroms ($A^2$)), and it has a low ionization energy of 5.4 eV. The corresponding excitation and ionization energies for a noble gas atom at the ground state are more than twice as large. As a result, the average electron energy in a discharge medium containing gaseous Lithium may be considerably lower than that in a discharge medium containing pure noble gases. Thus having atomic Lithium in the discharge medium may result in a considerable reduction in the anode potential fall, which in turn may result in reduce sputtering and damage to the anode surface, thus extending the anode's lifetime.

A thin coating of Lithium over the solid insulator between the anode and the cathode, may also help to resistively grade the surfaces of the electrodes, thereby causing a more uniform initiation of the discharge. Such uniform initiation may result in a more spatially and temporally uniform pinch. A more uniform discharge may also help in extending the life of the anode since the pinch may be generated more symmetrically, thereby preventing the discharge from striking at a preferred side of the anode and increasing the plasma sputtering on that side.

As discussed above, a preferred medium for efficient production of 13.5 nm radiation in a plasma pinch is Lithium vapor at a pressure in the range of a few hundredth of a torr to about a torr. This vapor pressure corresponds to a temperature range of approximately 600 to 700° C. Reflective and transmissive optics positioned above the discharge chamber 36 and which may be used to channel, focus or direct the EUV radiation generated by the plasma pinch should be isolated from the hot and reactive plasma-producing environment by some optically (including EUV) transmissive interface, to prevent their being damaged. Even the thinnest practical solid window may cause unacceptably high absorption of the 13.5 nm radiation and thus a non-solid interface may be preferable.

Figure 5:
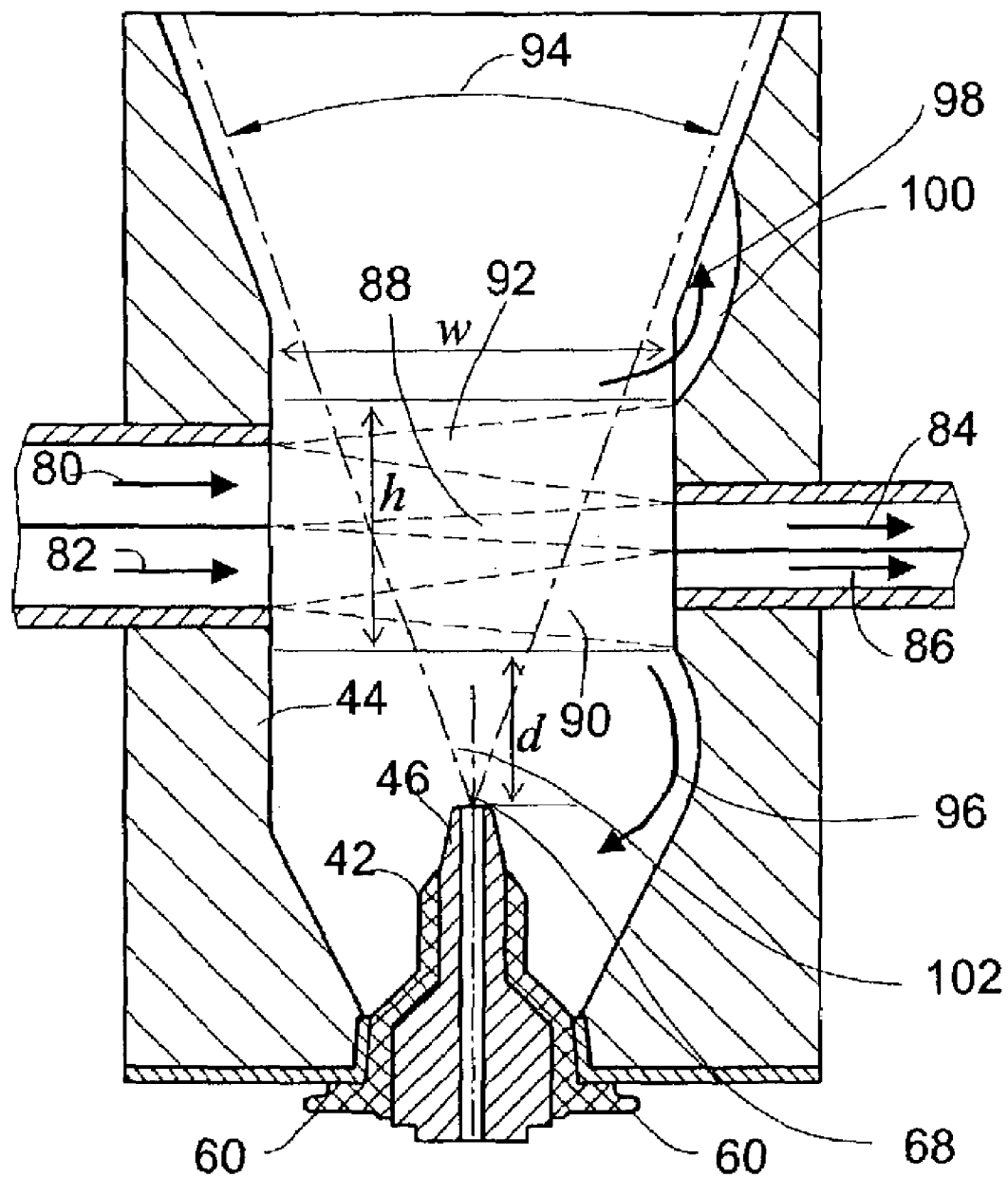
FIG. 5 is a cross-sectional schematic diagram of an example of a discharge chamber portion of a plasma radiation source including a gas curtain according to aspects of the invention.

According to various embodiments of the invention, such a non-solid interface between the DPF radiation source and the optics may be provided by a gas curtain, since the interface does not need to sustain any significant pressure differential. Referring to FIG. 5, there is illustrated one example of a gas curtain structure being used above and in the discharge chamber 36, according to aspects of the invention. Such a curtain may be constructed of two or more adjacent two-dimensional jets 80, 82 that emit streams of two gaseous media. The two jets may be used to maintain differences in the properties of the two gaseous media across large area interfaces while minimizing mixing. In one example, the two gaseous streams emitted by jets 80 and 82 may be composed of hot Lithium (Li) and of Helium (He) at approximately the same temperature as the Lithium. The Helium stream can be maintained at Lithium temperature to prevent Lithium condensation. The stream thicknesses should be sufficiently large to prevent penetration of unstable shear layers 90, 92 which are formed between stream gases and still gases, into the Li/He diffusion layer 88, over the full curtain height. The Li/He diffusion layer 88 is formed by mixing of the Li and He streams. The speed at which the gaseous media are emitted from the jets 80, 82 may be determined by the desired "stiffness" of the gas curtain. For example, for this embodiment of the gas curtain above the discharge chamber 36 of a DPF radiation source, the dynamic pressure, (related to the velocity of the gas streams), may be made larger than the anticipated lateral over-pressure. The Lithium and Helium jets may be of similar thickness. This thickness depends on the gas density and velocity and on the span of the curtain. For a span of 6.0 cm the jet thicknesses may be approximately 3.0 cm. For larger spans, the thickness increases as the square root of the span. The apparatus may further include a corresponding single or pair of recovery grilles/ducts 84, 86 to recapture the curtain gas streams so that the gases may be recirculated.

FIG. 5 illustrates a Helium source jet 80 and a Lithium source jet 82 to the left and two receiving ducts 84, 86 at the downstream (right) end of the curtain. The two jets may be closely matched in source speed to minimize mixing across the diffusion layer 88 between the two gaseous streams emitted by the jets 80, 82. The thickness of the Lithium stream as it exits source jet 82 may be such that the Li/Li shear layer 90 and the Li/He diffusion layer 88 do not overlap. Similarly the Helium stream thickness at the jet exit 80 should be such that He/He shear layer 92 and the Li/He diffusion layer do not overlap. The curtain height h and width w are determined by the distance of the curtain from the pinch 68 and by the optics acceptance angle 94. For example, a distance d of 7 cm from the pinch 68 to the curtain and an optics acceptance angle 94 of 45° corresponds to approximately a 6 by 6 cm curtain.

According to the illustrated embodiment, one receiving duct 84 may be sized so as to capture substantially the entire laminar diffusion layer 88 so that Lithium can be separated out and recycled by condensation and re-evaporation. Lithium may be separated from Helium by condensation and the liquid Lithium can be returned through a wick by capillary action, as known to those of skill in the art (not illustrated). The liquid Lithium may then be re-evaporated and reused in the Lithium stream for the gas curtain and/or in the DPF radiation source, as discussed above.

According to another aspect of the invention, the lower exit duct 86 may be provided and sized to extract sufficient pure Lithium (from the Li/Li shear layer 90) to supplement the hot gaseous Lithium of the Lithium jet stream in the gas curtain. In principle, this lower stream does not need to be condensed and subsequently re-evaporated, although this may be a practical method for recirculation. Spillover Lithium may also simply be circulated within the discharge chamber 36 as indicated by arrow 96. Similarly, spillover Helium may also be circulated in the optical cavity/discharge chamber 36, as indicated by arrow 98, after passing over an array of cooling fins 100.

The practicality of using the above-described gas curtain to achieve isolation between the DPF radiation source and the receiving optics may be assessed on the basis of estimates of curtain thickness, mass flow rates and evaporator/condenser heat loads. Diffusion of Lithium from the Lithium stream may be rapid at relatively high Lithium pressures, such as a torr, thus the jet speeds providing the Lithium and Helium gas streams should be high so as to control the curtain thickness and minimize diffusion. For example, matched Lithium and Helium jet source speeds of approximately 700 m/sec can be provided with gas stream thicknesses of 3.6 and 3.4 cm respectively, to achieve effective isolation between diffusion layer 88 and shear layers 90, 92. The associated mass flow rates are approximately 0.09 and 0.17 g/sec and the heat load for Lithium heating and evaporation (condensation and cooling) is approximately 2.1 kW. Of course it is to be appreciated that these figures are simply by way of examples for a particular size curtain in a particular environment and the invention is not limited to these specifics, but may be adapted to suit many particular applications.

Figure 6:
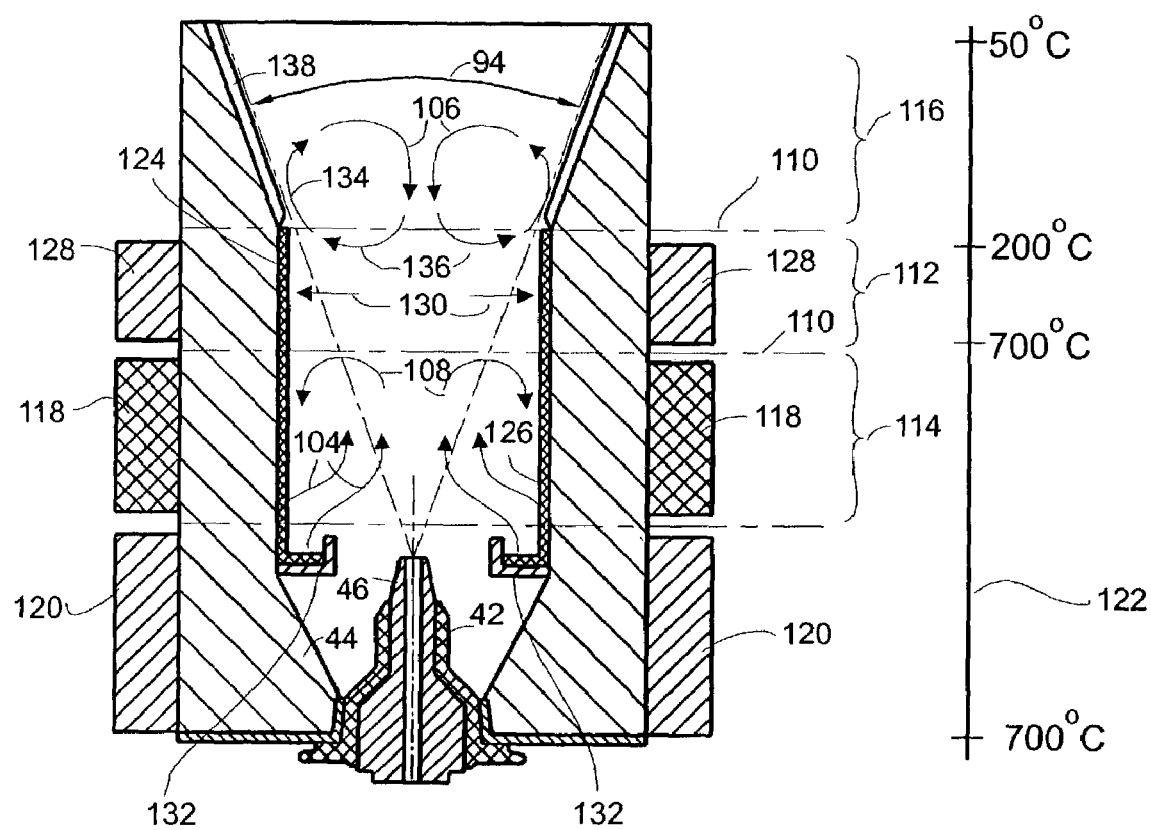
FIG. 6 is a cross-sectional schematic diagram of another example of a discharge chamber portion of a plasma radiation source, including a gas curtain, according to aspects of the invention.

According to another embodiment, as illustrated in FIG. 6, an alternative gas curtain configuration may comprise an axisymmetric flow design that may contain no external exhaust ducting or vapor processing. In this configuration Lithium vapor may be produced in the discharge chamber 36 and allowed passively to flow, as indicated by arrows 104 toward an oppositely-directed flow 106 of noble buffer gas (Helium or other noble gas). The two streams, of Lithium and noble gas, may meet as axial flows in opposing directions and may be convected radially toward the cylinder walls 124, 126 of the enclosure, as shown in FIG. 6 by arrows 108. Mixing of the Lithium and the noble gas by laminar diffusion may occur over some distance which is determined by the size of the curtain, the diffusion coefficient and the convection speed of the gases. For example, for a Lithium characteristic convection speed of 175 m/sec a mixing layer 112 may have a thickness of approximately 5 cm. Precise control of the temperatures of the walls 124, 126 may produce convection layers 114, 116 and the diffusion/mixing layer 112 as illustrated in FIG. 6.

Referring to FIG. 6, the flow of Lithium is driven by Lithium evaporation (shown by arrows 104) at the base of the discharge chamber 36. The cylinder walls may be thermally insulated by vacuum and by thermal radiation shielding 118 disposed between a base heater 120 and an upper collar 128. The base heater 120 may be used to heat the Lithium vapor to approximately 700° C. and to maintain the Lithium vapor pressure at about a torr. The collar 128 may include both heating and cooling capabilities to maintain a temperature gradient from 700° C. near the base of the device to approximately 200° C. over the height of the mixing layer 112, as shown by the line graph 122 in FIG. 6. This temperature gradient may provide a variation in Lithium pressure at the walls 124, 126, from approximately a torr at the bottom of the mixing layer 112 to a negligible value at the top of the mixing layer 112. The Lithium pressure throughout may actually be controlled by the noble gas pressure, and the vertical location of the mixing layer 112 (interface with convection layer 114 and interface with convection layer 116), indicated by lines 110, may be determined by controlling the heating in the base heater 120 and the collar 128. Lithium condensation may occur in the lower region of the collar area, as shown by arrows 130 and may flow within a wick 124 to the base region for re-evaporation. According to one example, the heating/cooling load for the above conditions may be approximately 2 kW. The heating demand on the heater 120 and the cooling demand on the collar 128 are such as to maintain sufficient Lithium evaporation and condensation to sustain the flow, and to provide the desired vapor pressure. In some examples, significant non-condensing Lithium circulation may also occur. In addition, closed circuit noble gas flow may follow the path 134, 106, 136 indicated in FIG. 6. Upward flow 134 of the noble gas along the conical wall of the cathode 44 may be cooled through wall mounted fins 138 to compensate for heating by the hot Lithium within the mixing layer 112. In some embodiments, some exhaust and feedback of the noble gas to supplement the noble gas source flow may be included to maintain system purity.

Figure 7:
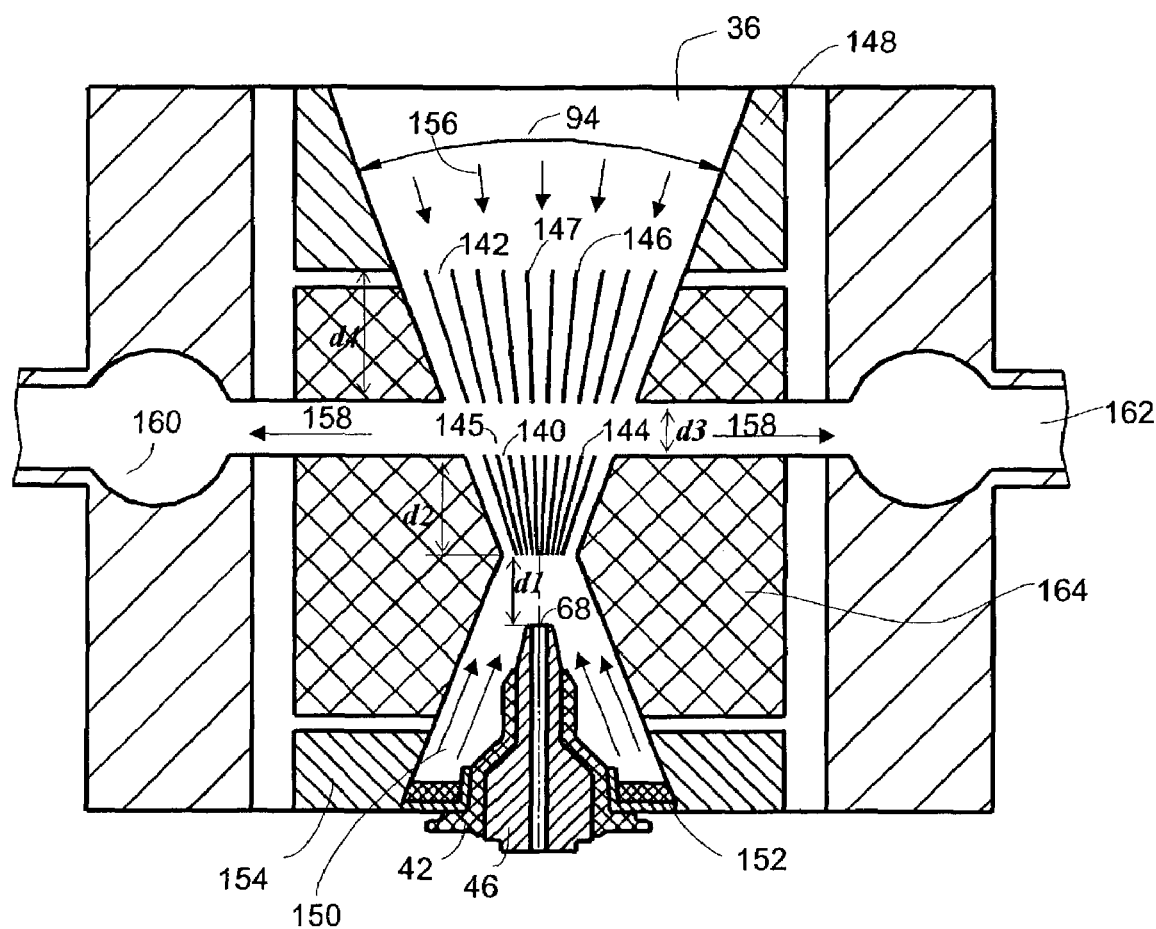
FIG. 7 is a schematic diagram of another example of a discharge chamber portion of a plasma radiation source according to aspects of the invention.

According to yet another embodiment, an alternative configuration for isolation of reflective and transmissive optics from the hot Lithium environment may comprise at least one layer of optically transmissive physical barriers 144, 146, as is illustrated in FIG. 7. A barrier comprising one or more series of open channels 140, 142 separated by thin webs of refractory metal elements 144, 146, respectively, is illustrated in FIG. 7. The web refractory elements 144, 146 may be configured, for examples, as radial fins or as concentric truncated cones or as a diverging honeycomb. Considering a honeycomb configuration, all walls of the cell array elements 145, 147 may be aligned with the pinch 68, as illustrated, so as to minimize optical blockage of 13.5 nm light in passage from the plasma source to optics (not shown) located above the discharge chamber 36. The cell array elements 145, 147 may be constructed as thin as practical and should be precisely aligned also to minimize optical blockage. In one selected example the distance d1 from the pinch 68 to a first cell array 145 may be approximately 5 cm. The first cell array 145 may have a depth d2 of approximately 5 cm and may be separated from a second cell array 147 of equal depth by a distance d3 of approximately 1 cm. Total optical blockage of the optical signal from the DPF radiation source due to the cell arrays may be held to a maximum of approximately 25%, considering practical thickness of the cell array elements and positioning and alignment tolerances. Of course it is to be appreciated that these dimensions are only one example and the invention contemplates many different sizes of and distances between cell arrays depending upon particular applications.

In addition to the useable radiation at 13.5 nm, broadband radiation, from the plasma and the pinch, may be emitted from a comparatively large region throughout the discharge chamber. This broadband radiation arises from the vapors present in the discharge chamber. For a capacitor stored energy of 20 Joules in the driver circuit 28 (see FIG. 2, capacitor not illustrated) and a pulse rate of 2,500 Hz, the incident radiation flux at the first cell array 145 may be approximately 50 W/Cm$^2$. The cell array structures 145, 147 are aligned with the pinch focus point so as to allow the desired 13.5 nm radiation to pass through the cell structures 145, 147 with minimal blockage. However, other broadband radiation generated by ionization and heating of the vapors in the discharge chamber arises from a large area and thus this radiation may be absorbed within the cell array structures 145, 147. The absorbed radiation may cause the cell array structures to heat up. A major mechanism for cell array cooling may be re-radiation, since conduction to the chamber wall may be limited by the thinness of the cell array structure. An energy balance based on re-radiation indicates the temperature of the cell array wall structures may rise to approximately 900° C., or even higher. This temperature is well within the operating range of refractories such as Tungsten or Tantalum and is sufficient to ensure no condensation of the Lithium vapor on the cell array wall structures. Removal of re-radiated heat from the cell arrays may be achieved simply by active cooling of the walls 148 of the discharge chamber through coolant channels (not shown) and of the optics (not shown).

According to one embodiment, Lithium evaporation 150 may be provided from a wick 152 at the base of the discharge chamber 36 by a heating mechanism 154. A downward flow of Helium (or other noble gas) 156 may be provided in the optics/discharge chamber 36 to prevent escape of the Lithium vapor. Helium (or other noble gas) would be supplied through a valve and manifold at the top of the chamber (not shown). Flows of the Lithium and Helium may merge in a space between the cell arrays 145, 147 and the merged gas mixture 158 may be removed by pumping it through a ring manifold 160 and a series of exit tubes 162. Thermal shielding 164 may provide isolation between the hot chamber and the exiting tubes/ducts. The exiting merged gas mixture 158 may be cooled to approximately 200° C. to allow condensation of the Lithium vapor. A wick may be provided to then return the liquid Lithium to the discharge chamber 36 where it may be reevaporated. An important consideration during the operation of the plasma source is the maintenance of large pressure drops through the cell arrays so that exiting flows of Lithium and Helium may be in the free molecular regime when they mix and exit the discharge chamber 36. This can be achieved in keeping with constraints on cell array optical blockage (which should be minimized, as discussed above) and with practical characteristics of the exiting manifold structure and size of the discharge chamber 36, provided the Lithium vapor pressure in the pinch is of the order of less than one torr. As discussed above, for efficient generation of 13.5 nm radiation the Lithium vapor pressure should be approximately in the range of 100 to 500 mtorr , which may result in a Lithium mass flow rate of 4 to 2 mg/s and an associated evaporation and condensation heat load of about 70 to 400 Watts.

As discussed above, the electrical discharge that produces the plasma pinch may also cause slow erosion of the electrodes (through wear on the electrodes). In most embodiments it may be desirable to isolate the optics from the products of electrode erosion. Referring to FIG. 7, this erosion may occur mainly at the anode 46 over an area that is large compared to the pinch dimension. The channeled Li/He separators (cell arrays) 145, 147 illustrated in FIG. 7 may effectively block generated erosion particles while still effectively transmitting 13.5 nm radiation from a small pinch volume. Thus, it is to be appreciated that, according to another aspect of the invention, if protection of the optics from erosion debris is desired, then an element such as one of the diverging cell arrays 145, 147 may be appropriately inserted between the pinch 68 and the Li/He interface for either of the configurations illustrated in FIGS. 5 and 6.

The electrical discharge that produces the plasma pinch may also produce a strong overpressure in the gas (vapor). The pulse overpressure may cause some destabilizing effect on the Lithium/Helium interface of the gas curtains in any of the embodiments shown in FIGS. 5–7. Gas overpressures in the region of the pinch can be so intense and so confined that the pressure pulse propagation may be well assessed by the so-called "theory of intense explosions." According to this theory, in continuum flow, the gas behind a spherically propagating shock wave has a pressure pulse strength and dimensions that are dependent only on the deposited energy and on the distance from the explosion point. The strength of the shock wave may be characterized in terms of a ratio of the gas pressure in front of the shock wave to the initial gas pressure, i.e., $P1/P0$, or may be characterized in terms of Mach number, i.e., a ratio of the velocity of the wave front to the velocity of sound in the medium. The velocity of the wave front is proportional to the square root of the shock strength ($P1/P0$). The shock wave strength decays inversely as the cube of the distance from the pinch. During the pressure pulse the local gas is highly compressed and shifted outward by a distance of the order of the post-shock velocity times the interaction time. This radial shift is independent of the deposited energy and scales directly with the distance from the pinch.

According to one example, the distance d from the pinch 68 to the center of the curtain in FIG. 5 may be approximately 7 cm. For a stored energy of 20 Joules, the corresponding overpressure may be approximately 18 torr and the estimated radial shift of the curtain is about 1.0 cm. This shift is fairly small compared to the height h of the curtain, which is about 7 cm, although the overpressure is large compared with the base pressure of the Lithium vapor which is about 0.5 torr. As a result of the overpressure, some destabilization of the curtain flow process may occur. A first flow clearing time (i.e. time for the flow to return to normal after the overpressure shock wave has dissipated) is associated with gas curtain speed and length, and may be of the order of approximately 0.1 ms for the above example sizes and properties of the apparatus depicted in FIG. 5. A second flow clearing time is associated with the diffusion layer embodiment illustrated in FIG. 6 and is dependent on the characteristic gas speed and radius. For this example, the flow clearing time may be of the order of 0.2 ms for the above example. These clearing times as compared to the interpulse time at a pulse rate of 5,000 Hz, suggest that recovery from pressure pulse destabilization will be faster for the gas curtain embodiment of FIG. 5.

Similarly there may be some pulse pressure destabilizing effect in the channel flow embodiment shown in FIG. 7. However, because this embodiment utilizes a solid structure rather than gas barriers, it may be more likely to be stable in the presence of the pressure disturbances that result from the pinched discharge. Furthermore it may also serve as a trap to protect optics from debris that sputters from the discharge electrodes, and this embodiment may thus be a preferred solution.

For at least the above reasons, it may be particularly desirable to efficiently generate EUV radiation with as small an energy per pulse as possible. Using Lithium to generate the EUV radiation is efficient because doubly ionized Lithium radiates almost exclusively at 13.5 nm, whereas heavier gases, which may radiate partially at 13.5 nm, also radiate at many other wavelengths. Increasing the production efficiency of the EUV radiation, for example, by lowering the amount of Lithium required to generate each plasma pinch, and reducing the waste heat removal may also allow for smaller radiating structures. This may be achieved in part by accurate timing of the Lithium feeding of the discharge relative to the plasma pinch pulse, as discussed above. As a result of smaller radiation structures, the collecting optics may be mounted closer to the pinch, allowing the EUV radiation to be collected from a larger solid angle which in turn increases the collection efficiency. In addition, decreasing the energy per pulse reduces the intensity of the shock wave generated by the pinch, alleviating the constraints on the design of the helium flow curtain discussed above.

Various illustrative examples of plasma radiation sources including means for cooling and protecting the anode and cathode electrodes, shielding the optics from the Lithium environment and feeding the Lithium to the plasma discharge chamber have been described above in terms of particular dimensions and characteristics. However, it is to be appreciated that the invention is not limited to the specific examples described herein and the principles may be applied to a wide variety of plasma guns and radiation sources. The above description is therefore by way of example only, and includes any modifications and improvements that may be apparent to one of skill in the art. The scope of the invention should be determined from proper construction of the appended claims and their equivalents.

What is claimed is:

1. A dense plasma focus radiation source comprising:
    a plasma radiation source adapted to produce extreme ultraviolet (EUV) radiation;
    a first gas jet providing a first gas stream at a first exit speed and having a first temperature;
    a second gas jet providing a second gas stream at a second exit speed substantially equal to the first exit speed and having a second temperature substantially equal to the first temperature, the first and second gas streams together comprising a gas curtain comprising a diffusion layer disposed between the first and second gas streams; and
    a first recovery duct positioned and sized so as to capture a substantial portion of the diffusion layer.

2. The dense plasma focus radiation source of claim 1, wherein the plasma radiation source comprises:
    an anode;

a cathode;

a heat pipe constructed to bring a liquid element in close proximity to the anode, so as to cool the anode; and a discharge circuit adapted to cause a plasma discharge, using Lithium vapor in a discharge chamber, between the anode and the cathode so as to generate EUV radiation at electromagnetic wavelengths near 13.5 nm.

3. The dense plasma focus radiation source as claimed in claim 2, wherein the liquid element is selected from a group consisting of Lithium, Sodium and Potassium.

4. The dense plasma focus radiation source as claimed in claim 2, wherein the liquid element is Lithium and wherein the Lithium is used in vapor form by the dense plasma focus radiation source to generate the EUV radiation.

5. The dense plasma focus radiation source as claimed in claim 4, wherein the heat pipe includes a wick that transfers liquid Lithium from a cold region of the heat pipe to an evaporation region of the heat pipe by capillary action.

6. The dense plasma focus radiation source as claimed in claim 5, wherein the heat pipe includes capillary holes in the evaporation region of the heat pipe to allow the Lithium to evaporate into the discharge chamber.

7. The dense plasma focus radiation source as claimed in claim 1, where the cathode is disposed coaxial with the anode, and further comprising:

a first electrical insulator disposed at least partially about the anode; and a second electrical insulator disposed at least partially about the cathode.

8. The dense plasma focus radiation source as claimed in claim 7, wherein the first electrical insulator comprises Aluminum Nitride.

9. The dense plasma focus radiation source as claimed in claim 7, wherein the second electrical insulator comprises quartz.

10. The dense plasma focus radiation source as claimed in claim 7, further comprising an intermediate electrical insulator disposed between the first electrical insulator and the second electrical insulator and providing a link between the first electrical insulator and the second electrical insulator.

11. The dense plasma focus radiation source as claimed in claim 10, wherein the intermediate electrical insulator comprises a vacuum.

12. The dense plasma focus radiation source as claimed in claim 7, wherein each of the first and second electrical insulators comprise respective terminating surfaces and wherein the terminating surfaces are shaped so as to prevent surface tracking.

13. The dense plasma focus radiation source as claimed in claim 1, wherein the heat pipe comprises an evaporation section in which the liquid element evaporates to a vapor and a condensation region where the vapor is condensed to the liquid element.

14. The dense plasma focus radiation source as claimed in claim 1, wherein the plasma radiation source further comprises a porous, Lithium-impregnated electrode disposed within the anode, and a radio frequency (RF) discharge circuit that is adapted to drive Lithium from the porous, Lithium-impregnated anode so as to provide Lithium vapor to the discharge chamber.

15. The dense plasma focus radiation source as claimed in claim 14, wherein the RF discharge circuit is adapted to apply an RF voltage to the anode and to the porous Lithium-impregnated electrode so as to heat the porous, Lithium-impregnated electrode to a temperature at which Lithium evaporates from the porous, Lithium-impregnated electrode, thereby driving Lithium from the porous, Lithium-impregnated electrode.

16. The dense plasma focus radiation source as claimed in claim 14, further comprising noble gas ions disposed about the porous, Lithium-impregnated electrode, and wherein the RF discharge circuit is adapted to apply an RF voltage to the anode and to the porous Lithium-impregnated electrode so as to create a positively-charged sheath in proximity to the porous, Lithium-impregnated electrode, the positively charged sheath causing acceleration of the noble gas ions toward the porous, Lithium-impregnated electrode so as to extract Lithium from the porous, Lithium-impregnated electrode by ion extraction.

17. The dense plasma focus radiation source as claimed in claim 1, further comprising optical elements disposed above the anode and the cathode and adapted to receive at least some of the EUV radiation produced by the dense plasma focus radiation source; and wherein the gas curtain comprises an optically transmissive barrier disposed between the optical elements and the anode.

18. The dense plasma focus radiation source as claimed in claim 17, wherein the optically transmissive barrier further comprises a web of refractory metal elements defining a series of open channels substantially aligned to transmit the radiation from a plasma pinch focus point of the anode.

19. The dense plasma focus radiation source as claimed in claim 18, wherein the refractory metal elements comprise Tungsten.

20. The dense plasma focus radiation source as claimed in claim 17, further comprising a second recovery duct positioned and sized so as to capture a least a portion of the first gas stream.

21. The dense plasma focus radiation source as claimed in claim 20, wherein at least some of the Lithium vapor captured from first gas stream by the second recovery duct is reused to produce the first gas stream.

22. The dense plasma focus radiation source as claimed in claim 1, further comprising a layer of liquid Lithium covering at least a portion of the anode located within the discharge chamber.

23. The dense plasma focus radiation source as claimed in claim 1, further comprising a layer of liquid Lithium covering at least a portion of the cathode located within the discharge chamber.

24. The dense plasma focus radiation source of claim 1, further comprising optical elements positioned near the plasma radiation source and adapted to receive at least some of the radiation produced by the plasma radiation source; and wherein the gas curtain comprises an optically transmissive barrier disposed between the plasma radiation source and the optical elements.

25. The dense plasma focus radiation source as claimed in claim 24, wherein the optically transmissive barrier further comprises a web of refractory metal elements defining a series of open channels substantially aligned to transmit the radiation from the plasma pinch focus region to the optical elements.

26. The dense plasma focus radiation source as claimed in claim 25, wherein the refractory metal elements comprise Tungsten.

27. The dense plasma focus radiation source as claimed in claim 24, wherein the plasma radiation source comprises an anode and a cathode disposed in a coaxial arrangement about a longitudinal axis passing through a center of the anode.

28. The dense plasma focus radiation source as claimed in claim 27, further comprising:
- a first electrical insulator disposed at least partially about the anode; and
- a second electrical insulator disposed at least partially about the cathode.

29. The dense plasma focus radiation source as claimed in claim 28, wherein the first electrical insulator comprises Aluminum Nitride.

30. The dense plasma focus radiation source as claimed in claim 28, wherein the second electrical insulator comprises quartz.

31. The dense plasma focus radiation source as claimed in claim 28, further comprising an intermediate electrical insulator disposed between the first electrical insulator and the second electrical insulator and providing a link between the first electrical insulator and the second electrical insulator.

32. The dense plasma focus radiation source as claimed in claim 31, wherein the intermediate electrical insulator comprises a vacuum.

33. The dense plasma focus radiation source as claimed in claim 28, wherein each of the first and second electrical insulators comprise respective terminating surfaces and wherein the terminating surfaces are shaped so as to prevent surface tracking.

34. The dense plasma focus radiation source as claimed in claim 27, further comprising a heat pipe constructed to bring liquid Lithium in close proximity to the anode, thereby effecting cooling of the anode.

35. The dense plasma focus radiation source as claimed in claim 34, wherein the heat pipe comprises an evaporation section in which the liquid element evaporates to a vapor and a condensation region where the vapor is condensed to the liquid element.

36. The dense plasma focus radiation source as claimed in claim 34, wherein the liquid element is selected from a group consisting of Lithium, Sodium and Potassium.

37. The dense plasma focus radiation source as claimed in claim 34, wherein the liquid element is Lithium and wherein the Lithium is used in vapor form by the dense plasma focus radiation source to generate the EUV radiation.

38. The dense plasma focus radiation source as claimed in claim 37, wherein the heat pipe includes a wick that transfers liquid Lithium from a cold region of the heat pipe to an evaporation region of the heat pipe by capillary action.

39. The dense plasma focus radiation source as claimed in claim 38, wherein the heat pipe includes capillary holes in the evaporation region of the heat pipe to allow the Lithium to evaporate into the discharge chamber.

40. The dense plasma focus radiation source as claimed in claim 27, further comprising a layer of liquid Lithium covering at least a portion of the anode.

41. The dense plasma focus radiation source as claimed in claim 27, further comprising a layer of liquid Lithium covering at least a portion of the cathode.

42. The dense plasma focus radiation source as claimed in claim 24, wherein the plasma radiation source comprises an anode, a porous, Lithium-impregnated electrode disposed within the anode, and a radio frequency (RF) discharge circuit that is adapted to drive Lithium from the porous, Lithium-impregnated anode so as to provide Lithium vapor to the plasma pinch focus region.

43. The dense plasma focus radiation source as claimed in claim 42, wherein the RF discharge circuit is adapted to apply an RF voltage to the anode and to the porous Lithium-impregnated electrode so as to heat the porous, Lithium-impregnated electrode to a temperature at which Lithium evaporates from the porous, Lithium-impregnated electrode, thereby driving Lithium from the porous, Lithium-impregnated electrode.

44. The dense plasma focus radiation source as claimed in claim 42, further comprising noble gas ions disposed about the porous, Lithium-impregnated electrode, and wherein the RF discharge circuit is adapted to apply an RF voltage to the anode and to the porous Lithium-impregnated electrode so as to create a positively-charged sheath in proximity to the porous, Lithium-impregnated electrode, the positively charged sheath causing acceleration of the noble gas ions toward the porous, Lithium-impregnated electrode so as to extract Lithium from the porous, Lithium impregnated electrode by ion extraction.

45. The dense plasma focus radiation source as claimed in claim 1, wherein the first gas stream comprises Lithium and the second gas stream comprises a noble gas.

46. The dense plasma focus radiation source as claimed in claim 45, wherein the noble gas comprises Helium.

47. The dense plasma focus radiation source as claimed in claim 1, further comprising a second recovery duct positioned and sized so as to capture at least a portion of the first gas stream.

48. The dense plasma focus radiation source as claimed in claim 47, wherein the first gas stream comprises of Lithium and wherein at least some of the Lithium vapor captured by the second recovery duct is reused to produce the first gas stream.

49. The dense plasma focus radiation source as claimed in claim 1, wherein the plasma radiation source comprises an anode, a cathode positioned coaxial with the anode, and a heat pipe constructed to bring Lithium into close proximity with the anode so as to cool the anode.

50. The dense plasma focus radiation source as claimed in claim 49, further comprising:
- a first electrical insulator disposed at least partially about the anode;
- a second electrical insulator disposed at least partially about the cathode.

51. The dense plasma focus radiation source as claimed in claim 50, further comprising an intermediate electrical insulator disposed between the first electrical insulator and the second electrical insulator and providing a link between the first electrical insulator and the second electrical insulator.

52. The dense plasma focus radiation source as claimed in claim 49, further comprising a layer of liquid Lithium covering at least a portion of the anode.

53. The dense plasma focus radiation source as claimed in claim 49, further comprising a layer of liquid Lithium covering at least a portion of the cathode.

54. The dense plasma radiation source of claim 1 wherein the plasma radiation source comprises a plasma pinch focus point; and the dense plasma radiation source further comprises:
- optical elements positioned above the plasma radiation source and adapted to receive at least some of the EUV radiation produced by the plasma radiation source; and
- a first web of refractory metal elements defining a series of open channels substantially aligned with the plasma pinch focus point and disposed between the plasma radiation source and the optical elements.

55. The dense plasma radiation source as claimed in claim 54, wherein the plasma radiation source comprises an anode and a cathode disposed in a coaxial arrangement, the plasma radiation source being adapted to generate an electromagnetic field between the anode and the cathode so as to produce the radiation.

56. The dense plasma radiation source as claimed in claim 55, further comprising a first insulator disposed substantially about the anode and a second insulator disposed substantially about the cathode.

57. The dense plasma focus radiation source as claimed in claim 54, wherein the radiation source comprises a porous anode and a reservoir containing liquid Lithium, wherein the porous anode is constructed to absorb the liquid Lithium from the reservoir.

58. The dense plasma focus radiation source of claim 1, wherein the plasma radiation source comprises an anode and a cathode disposed coaxial with the anode in a discharge chamber and is adapted to generate EUV radiation using Lithium vapor extracted from the anode; and the dense plasma radiation source further comprises:
   a pulsed discharge circuit adapted to generate an electromagnetic (EM) field between the anode and the cathode so as to cause a plasma pinch at a tip of the anode, the plasma pinch generating the EUV radiation; and
   a radio frequency (RF) discharge circuit adapted to effect extraction of the Lithium vapor from the anode.

59. The dense plasma focus radiation source as claimed in claim 58, wherein the anode contains a Lithium-filled electrode, and wherein RF discharge circuit is constructed to generate an RF voltage across the anode and the Lithium-filled electrode.

60. The dense plasma focus radiation source as claimed in claim 59, wherein the RF voltage is applied to heat the Lithium-filled electrode to a temperature sufficient to cause evaporation of Lithium from the Lithium-filled electrode, thereby driving Lithium from the Lithium-filled electrode into the discharge chamber.

61. The dense plasma focus radiation source as claimed in claim 59, further comprising noble gas ions disposed about the Lithium-filled electrode, and wherein the RF discharge circuit is adapted to apply an RF voltage to the anode and to the Lithium-filled electrode so as to create a positively-charged sheath in proximity to the Lithium-filled electrode, the positively charged sheath causing acceleration of the noble gas ions toward the Lithium-filled electrode so as to extract Lithium from the Lithium-filled electrode by ion extraction.

62. The dense plasma focus radiation source as claimed in claim 58, further comprising a heat pipe constructed to bring liquid Lithium in close proximity to the anode so as to cool the anode.

63. The dense plasma focus radiation source as claimed in claim 62, wherein the heat pipe includes a wick that transfers the liquid Lithium from a cold region of the heat pipe to an evaporation region of the heat pipe by capillary action.

64. The dense plasma focus radiation source as claimed in claim 63, wherein the heat pipe includes capillary holes in the evaporation region of the heat pipe to allow the Lithium to evaporate into the discharge chamber.

65. The dense plasma focus radiation source as claimed in claim 58, further comprising a layer of liquid Lithium covering at least a portion of the anode located within the discharge chamber.

66. The dense plasma focus radiation source as claimed in claim 58, further comprising a layer of liquid Lithium covering at least a portion of the cathode located within the discharge chamber.

67. The dense plasma focus radiation source as claimed in claim 58, further comprising optical elements disposed above the anode, and wherein the gas curtain comprises an optically transmissive barrier positioned between the anode and the optical elements and is arranged to allow transmission of the EUV radiation from the plasma pinch to the optical elements.

68. The dense plasma focus radiation source as claimed in claim 67, wherein the optically transmissive barrier further comprises a web of refractory metal elements defining a series of open channels substantially aligned to allow transmission of the EUV radiation from the plasma pinch to the optical elements.

69. The dense plasma focus radiation source as claimed in claim 68, wherein the refractory metal elements comprise Tungsten.

70. The dense plasma focus radiation source as claimed in claim 67, further comprising a second recovery duct positioned and sized so as to capture a least a portion of the first gas stream.

71. The dense plasma focus radiation source as claimed in claim 70, wherein at least some of the Lithium vapor captured from first gas stream by the second recovery duct is reused to produce the first gas stream.

72. The dense plasma focus radiation source as claimed in claim 58, further comprising:
   a first electrical insulator disposed at least partially about the anode; and
   a second electrical insulator disposed at least partially about the cathode.

* * * * *